United States Patent
Wang et al.

(10) Patent No.: US 8,216,767 B2
(45) Date of Patent: Jul. 10, 2012

(54) PATTERNING PROCESS AND CHEMICAL AMPLIFIED PHOTORESIST WITH A PHOTODEGRADABLE BASE

(75) Inventors: Chien-Wei Wang, Wufong Township, Taichung County (TW); Ching-Yu Chang, Yuansun Village (TW); Tsai-Sheng Gau, Hsin-Chu (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 367 days.

(21) Appl. No.: 12/555,145

(22) Filed: Sep. 8, 2009

(65) Prior Publication Data

US 2011/0059396 A1     Mar. 10, 2011

(51) Int. Cl.
*G03F 7/00* (2006.01)
*G03F 7/004* (2006.01)
*G03F 7/40* (2006.01)
*G03F 7/028* (2006.01)

(52) U.S. Cl. ......... 430/270.1; 430/270.19; 430/330; 430/905; 430/913; 430/927; 430/919

(58) Field of Classification Search .......... 430/270.1, 430/913, 905, 927, 270.19, 919, 330
See application file for complete search history.

(56) References Cited

U.S. PATENT DOCUMENTS

| | | | |
|---|---|---|---|
| 5,627,010 A | 5/1997 | Pai et al. | |
| 5,650,261 A * | 7/1997 | Winkle | 430/270.1 |
| 6,338,934 B1 | 1/2002 | Chen et al. | |
| 6,395,451 B1 | 5/2002 | Jung et al. | |
| 6,551,973 B1 | 4/2003 | Moore | |
| 6,884,561 B2 * | 4/2005 | Fromson et al. | 430/157 |
| 7,005,229 B2 * | 2/2006 | Nirmal et al. | 430/270.1 |
| 7,229,747 B2 * | 6/2007 | Park et al. | 430/322 |
| 7,507,520 B2 * | 3/2009 | Lee et al. | 430/270.1 |
| 7,645,812 B2 * | 1/2010 | Ahn et al. | 522/57 |
| 2003/0134221 A1 | 7/2003 | Nishiyama et al. | |
| 2003/0138737 A1 | 7/2003 | Wakiya et al. | |
| 2010/0151386 A1 * | 6/2010 | Shimizu et al. | 430/280.1 |
| 2010/0297419 A1 * | 11/2010 | Courtenay et al. | 428/220 |
| 2011/0097669 A1 * | 4/2011 | Fukui et al. | 430/281.1 |

FOREIGN PATENT DOCUMENTS

| | | | |
|---|---|---|---|
| EP | 2093269 A1 * | 8/2009 | |
| JP | 04134348 A * | 5/1992 | |
| JP | 2009036960 A * | 2/2009 | |
| WO | WO 2009094023 A1 * | 7/2009 | |

OTHER PUBLICATIONS

Machine translation of JP 2009-036960(no date).*
Wen-Li Wu et al., "Identifying Materials Limits of Chemically Amplified Photoresists", Advances in Resist Materials and Processing Technology XXIV, Proc. of SPIE vol. 6519, 651902 (2007), 0277-0786X/07, 11 pages.

(Continued)

*Primary Examiner* — Amanda C. Walke
(74) *Attorney, Agent, or Firm* — Haynes and Boone, LLP

(57) ABSTRACT

A method for fabricating an integrated circuit device is disclosed. The method includes providing a substrate; forming a first material layer over the substrate; forming a second material layer over the first material layer, wherein the second material layer comprises a photodegradable base material; and exposing at least a portion of the second material layer.

19 Claims, 3 Drawing Sheets

OTHER PUBLICATIONS

Cyril Nicolas et al., "Catalytic Aerobic Photooxidation of Primary Benzylic Amines Using Hindered Acridinium Salts", www.sciencedirect.com, May 23, 2005, 4 pages.

R.M. Finne et al., "A Water-Amine-Complexing Agent System for Etching Silicon", Journal of the Electrochemical Society, vol. 114, Issue 9, pp. 965-970, Sep. 1967.

* cited by examiner

US 8,216,767 B2

PATTERNING PROCESS AND CHEMICAL AMPLIFIED PHOTORESIST WITH A PHOTODEGRADABLE BASE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, conventional photoresist layers comprise a non-photodegradable base. The non-photodegradable base is not photosensitive, and thus, after an exposure process, exposed areas of a photoresist layer exhibit less than desirable acid distribution contrast and base distribution contrast. This leads to lower pattern contrast, resulting in poor pattern profiles, particularly as pattern features continue to decrease in size.

Accordingly, what is needed is a method and photoresist material for manufacturing an integrated circuit device that addresses the above stated issues.

SUMMARY

A photoresist material for semiconductor device patterning processes is provided. The photoresist material comprises a polymer, a photoacid generator, a quencher base, an electron acceptor, and a photodegradable base. The photodegradable base comprises an amine linked with a functional group comprising substantially delocalizable pi electrons by a —C— group. The photoresist material may further comprise at least one of a chromophore, a solvent, a surfactant, and/or crosslinker.

A method for fabricating an integrated circuit device is also disclosed. The method includes providing a substrate; forming a first material layer over the substrate; forming a second material layer over the first material layer, wherein the second material layer comprises a photodegradable base material; and exposing at least a portion of the second material layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
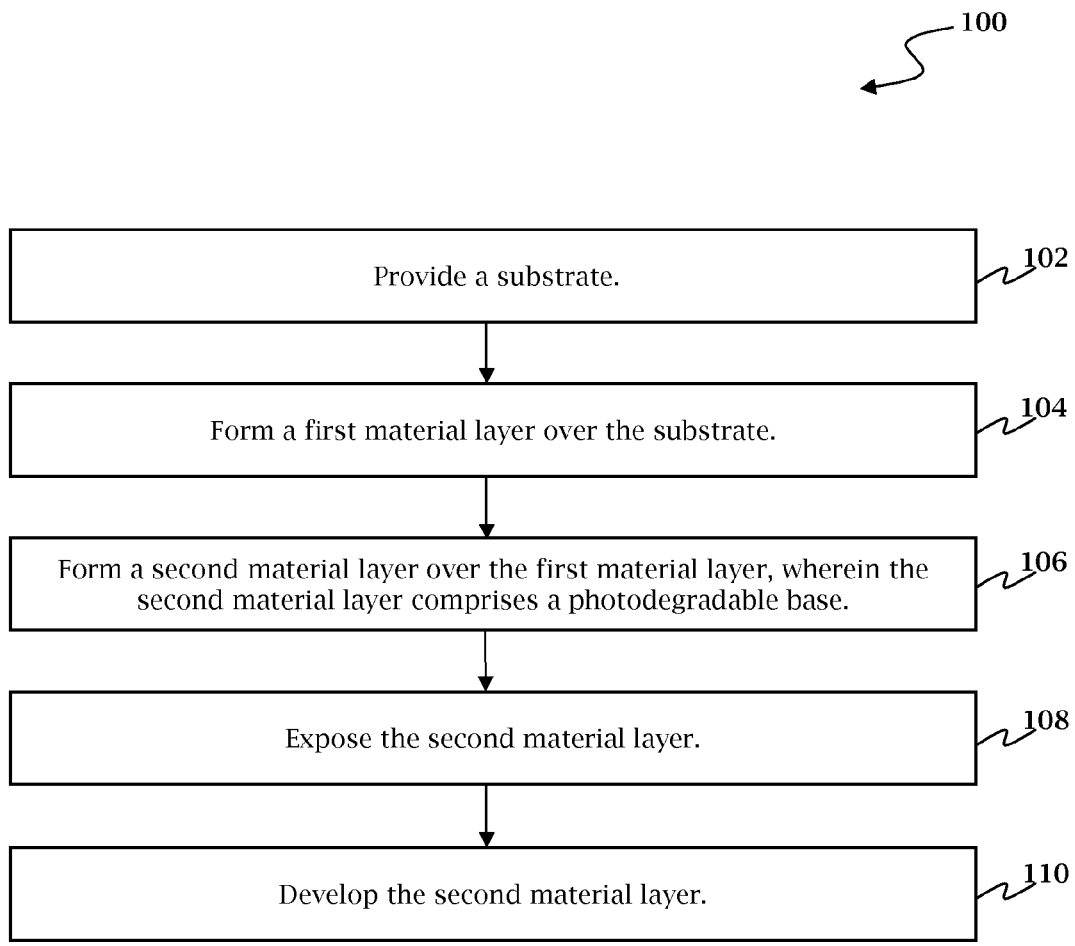
FIG. 1 is a flow chart of a method for fabricating a semiconductor device according to aspects of the present embodiments.

The present disclosure relates generally to methods for manufacturing semiconductor devices, and more particularly, to a method and photoresist for patterning various semiconductor device features.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
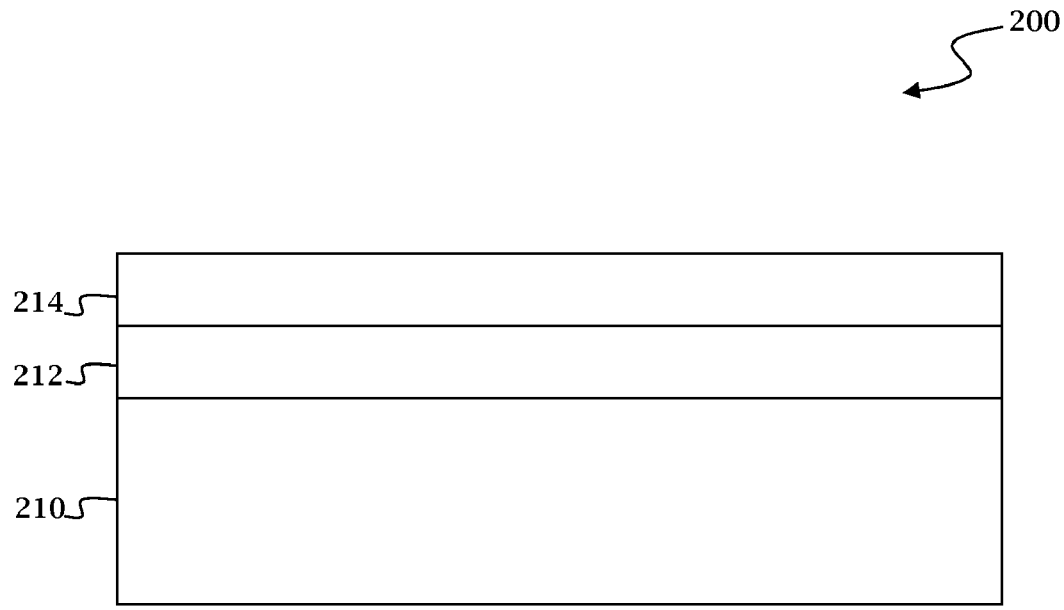
FIGS. 2A-2C are various cross-sectional views of embodiments of a semiconductor device during various fabrication stages according to the method of FIG. 1.
Figure 2B:
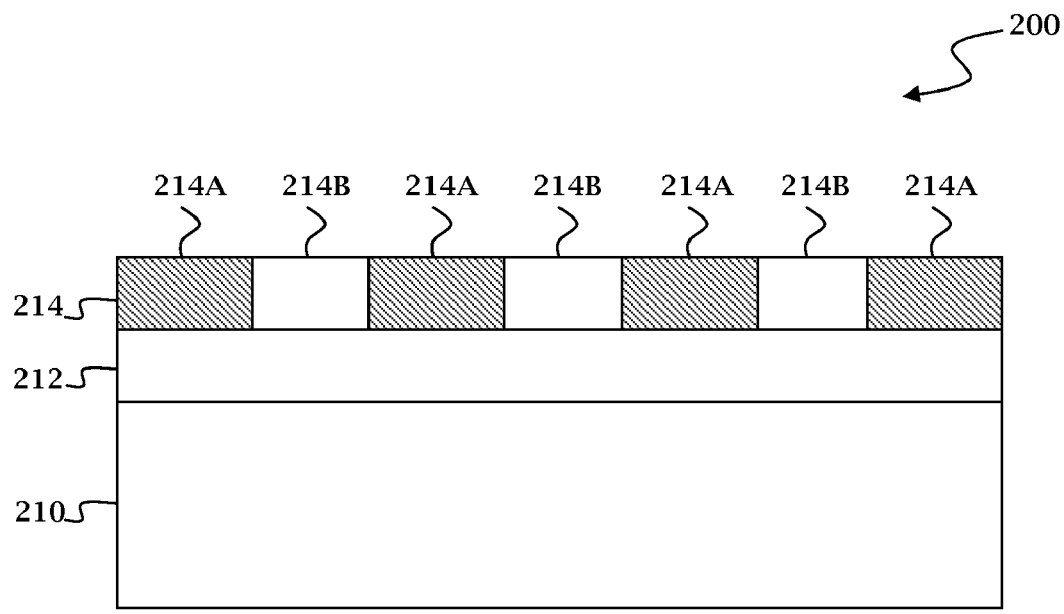
Figure 2C:
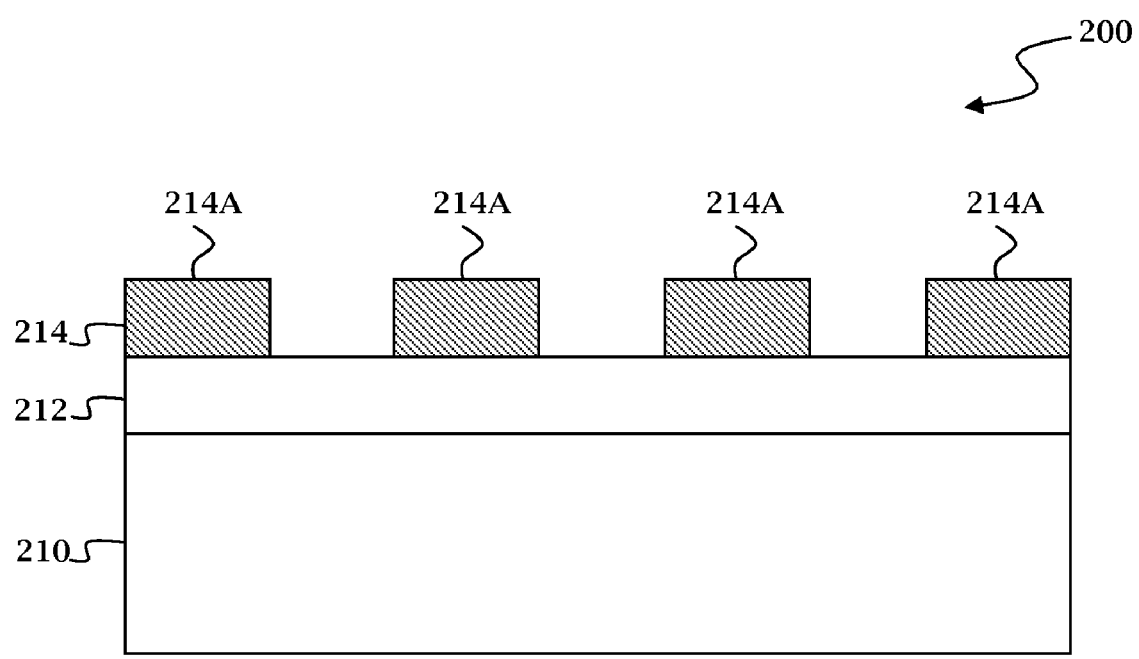

With reference to FIG. 1 and FIGS. 2A-2C, a method 100 and a semiconductor device 200 are collectively described below. The semiconductor device 200 may be an integrated circuit, or portion thereof, that may comprise memory cells and/or logic circuits. The semiconductor device 200 may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. FIG. 1 is a flow chart of one embodiment of the method 100 for making the semiconductor device 200. FIGS. 2A-2C are various cross-sectional views of the semiconductor device 200 according to one embodiment, in portion or entirety, during various fabrication stages of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

The method 100 is a lithography method for use in manufacturing a semiconductor device. The terms lithography, immersion lithography, photolithography, and optical lithography may be used interchangeably in the present disclosure. Photolithography is a process used in microfabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist. Baking processes, such as a post-exposure bake (PEB) or pre-exposure bake, may be performed before or after exposing the substrate. A developing process selectively removes the exposed or unexposed regions to a developing solution creating an exposure pattern over the substrate. A series of chemical treatments then engrave the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist, and the substrate is ready for the whole process to be repeated for the next stage of circuit fabrication. In a complex integrated circuit (for example, a modern CMOS), a substrate may go through the photolithographic cycle a number of times.

Referring to FIGS. 1 and 2A, the method 100 begins at step 102 wherein a substrate 210 is provided. The substrate 210 is a semiconductor substrate. The substrate 210 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure. Alternatively, the substrate 210 may include a non-semiconductor material, such as a glass substrate for thin-film-transistor liquid crystal display (TFT-LCD) devices, or fused quartz or calcium fluoride for a photomask (mask).

The substrate 210 may comprise one or more material layers. The one or more material layers may comprise one or more high-k dielectric layers, gate layers, hard mask layers, interfacial layers, capping layers, diffusion/barrier layers, dielectric layers, conductive layers, other suitable layers, and/or combinations thereof. A high-k dielectric layer may comprise hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. A gate layer may comprise silicon-containing materials; germanium-containing materials; metal, such as aluminum, copper, tungsten, titanium, tantulum, titanium nitride, tantalum nitride, nickel silicide, cobalt silicide, TaC, TaSiN, and/or TaCN; other suitable materials; and/or combinations thereof. In one example, the gate layer comprises a layer of silicon dioxide and a layer of high-k dielectric material. The gate layer may be doped polycrystalline silicon with the same or different doping. The gate layer may comprise a work function layer. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. In some examples, the work function layer may include doped-conducting metal oxide materials.

In one example, the substrate 210 comprises a dielectric layer. The dielectric layer exhibits a dielectric constant ranging between about 1 and about 40. In another example, the substrate 210 comprises at least one of silicon, a metal oxide, or a metal nitride. The composition of the substrate may be represented by a formula, $MX_b$, where M is a metal or Si, X is an N or O, and b ranges between about 0.4 and 2.5. Examples of substrate compositions including at least one of silicon, metal oxide, or metal nitride include $SiO_2$, silicon nitride, aluminum oxide, hafnium oxide, lanthanum oxide, other suitable compositions, and combinations thereof. In yet another example, the substrate 210 comprises at least one of a metal, a metal alloy, a metal nitride, a metal sulfide, a metal selenide, a metal oxide, or a metal silicide. The composition of the substrate may be represented by a formula, $MX_a$, where M is a metal, X is N, S, Se, O, or Si, and a ranges between 0.4 and 2.5. Examples of substrate compositions including at least one of metal, metal alloy, or metal nitride/sulfide/selenide/oxide/silicide include Ti, Al, Co, Ru, TiN, $WN_2$, TaN, other suitable compositions, and/or combinations thereof. Also, the substrate 210 may be substantially conductive or semi-conductive. For example, the electric resistance of the substrate 210 may be less than $10^3$ ohm-meter.

At steps 104 and 106, a first material layer 212 and a second material layer 214 are formed over the substrate 210. Alternatively, the first material layer 212 may be eliminated and the second material layer 214 may be formed over the substrate 210. The first material layer 212 comprises a different composition than the second material layer 214. The first and second material layers 212, 214 are coated on the substrate 210 to any suitable thickness by any suitable process, such as spin-on coating, chemical vapor deposition (CVD), plasma enhanced chemical vapor deposition (PECVD), atomic layer deposition (ALD), physical vapor deposition (PVD), high density plasma CVD (HDPCVD), other suitable methods, and/or combinations thereof. The first material layer 212 comprises a different optical property than the second material layer 214. For example, the first material layer 212 comprises substantially different refractive indexes (i.e., n values), extinction coefficients (i.e., k values), or T values than the second material layer 214. The first and second material layers 212, 214 further comprise different etching resistances. The first and/or second material layers 212, 214 may comprise at least one etching resistant molecule, such as a low onishi number structure, a double bond, triple bond, silicon, silicon nitride, Ti, TiN, Al, aluminum oxide, and/or SiON.

The first material layer 212 is a patterning layer. The patterning layer may comprise one or more photoresist layers, antireflective coating layers (e.g., a top antireflective coating layer (TARC) and/or a bottom antireflective coating layer (BARC)), high-k dielectric layers, gate layers, hard mask layers, interfacial layers, capping layers, diffusion/barrier layers, dielectric layers, conductive layers, other suitable layers, and/or combinations thereof. The patterning layer may be similar to those described above. In one example, the first material layer 212 comprises a bottom antireflective coating layer. In another example, the first material layer 212 comprises at least one of an acid labile molecule, photoacid generator (PAG), quencher, chromophore, crosslinker, surfactant, and/or solvent. This composition may provide the first material layer 212 with a different n value than the second material layer 214.

The second material layer 214 is a photoresist layer. The photoresist layer is a positive-type or negative-type resist material and may have a multi-layer structure. One exemplary resist material is a chemical amplifying (CA) resist. Conventional photoresist layers comprise a non-photodegradable base, which is not photosensitive. Thus, after an exposure process, conventional photoresist layers fail to confine acid distribution. The non-photodegradable base neutralizes the acid generated by a photoacid generator, resulting in a lower than desirable acid and base distribution contrast. This leads to lower pattern contrast after a developing (and/or post-exposure baking) process.

In the present embodiment, the second material layer 214 comprises a photodegradable base.

The photodegradable base is photosensitive. In contrast to conventional photoresist layers, after exposure, the photodegradable base is depleted in the exposure area, resulting in high acid and base distribution contrast. The photodegradable base does not substantially decrease an acid amount in the exposure areas, yet the acid distribution contrast is reduced by the high base distribution contrast. Thus, the photodegradable base provides improved profile contrast. The photodegradable base includes an amine, which links with one or more functional groups comprising substantially delocalizable pi (π) electrons by —C— groups. For example, the photodegradable base is represented by the following formula:

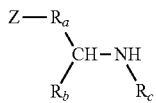

Z comprises one or more pendent groups. The pendent groups comprise at least one of the following: —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*, —C(O)R*, —Si(OR*)$_3$, —Si(R*)$_3$, epoxyl groups, other suitable groups, and/or combinations thereof. R* is hydrogen, an unbranched group, a branched group, a cyclic group, a noncyclic group, a saturated group, an unsaturated group, an alkyl group, an alkenyl group, an alkynyl group, or other suitable group.

R$_a$ comprises the one or more functional groups having a substantially delocalizable pi electron. Examples of R$_a$ include an aromatic ring group, a monovalent functional group, a divalent functional group, or a trivalent functional group. The functional groups comprise at least one of an alkene, alkyne, —CO—, —C(=O)O—, —S—, —P—, —P(O$_2$)—, —C(=O)S—, —O—, —N—, —C(=O)N—, —SO$_2$O—, —SO$_2$S—, —SO—, —SO$_2$—, other suitable functional groups, and/or combinations thereof.

R$_b$ comprises functional groups similar to R$_a$. For example, R$_b$ can comprise the one or more functional groups having a substantially delocalizable pi electron, which include an aromatic ring group, a monovalent functional group, a divalent functional group, or a trivalent functional group. The functional groups comprise at least one of an alkene, alkyne, —CO—, —C(=O)O—, —S—, —P—, —P(O$_2$)—, —C(=O)S—, —O—, —N—, —C(=O)N—, —SO$_2$O—, —SO$_2$S—, —SO—, —SO$_2$—, other suitable groups, and/or combinations thereof. R$_b$ may further comprise one of the following: R*, —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*, —C(O)R*, —Si(OR*)$_3$, —Si(R*)$_3$, epoxyl groups, other suitable groups, and/or combinations thereof. R* is hydrogen, an unbranched group, a branched group, a cyclic group, a noncyclic group, a saturated group, an unsaturated group, an alkyl group, an alkenyl group, an alkynyl group, or other suitable group.

R$_c$ comprises an unbranched group, a branched group, a cyclic group, a noncyclic group, a saturated group, an unsaturated group, an alkyl group, an alkenyl group, an alkynyl group, an aromatic group, other suitable groups, and/or combinations thereof. R$_c$ may further comprise one of the following: —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*, —C(O)R*, —Si(OR*)$_3$, —Si(R*)$_3$, epoxyl groups, other suitable groups, and/or combinations thereof. R* is hydrogen, an unbranched group, a branched group, a cyclic group, a noncyclic group, a saturated group, an unsaturated group, an alkyl group, an alkenyl group, an alkynyl group, or other suitable group.

The second material layer 214 further comprises at least one of a polymer, a photoacid generator (PAG), a quencher (base), an electron acceptor, a chromophore, and/or a solvent. The polymer comprises an organic or inorganic polymer with a molecular weight between approximately 1000 and 20,000. The polymer may include an acid cleavable polymer, an acid catalyzed crosslinkable polymer, a polymeric pinacol, and/or other suitable polymer. The electron acceptor may comprise at least one of the following: ketone, aldehyde, carboxylic acid, ester, amide, carbon dioxide, haloalkane, haloalkene, haloalkyne, alkene, alkyne, aromatic rings, other suitable groups, and/or combinations thereof. The second material layer 214 may further comprise a surfactant, a photobase generator (PBG), and/or crosslinker.

At step 108, at least one exposure process is performed on the second material layer 214. The exposure process selectively illuminates the second material layer 214 by a radiation beam to form one or more exposed portions 214A and unexposed portions 214B. The radiation beam used to expose the second material layer 214 may be ultraviolet and/or extended to include other radiation beams, such as ion beam, x-ray, extreme ultraviolet, deep ultraviolet, and other proper radiation energy. In one example, the second material layer 214 is exposed to a wavelength substantially less than 250 nm. The patterned exposed and unexposed portions 214A, 214B are formed by illuminating the second material layer with a radiation source through one or more photomasks (or reticles) to form an image pattern. The lithography process may implement krypton fluoride (KrF) excimer lasers, argon fluoride (ArF) excimer lasers, ArF immersion lithography, ultraviolet (UV) radiation, extreme ultra-violet (EUV) radiation, and/or electron-beam writing (e-beam). The exposing process may also be implemented or replaced by other proper methods such as maskless photolithography, ion-beam writing, and/or molecular imprint techniques. It is understood that a single exposure patterning process, double exposure patterning process, or multiple exposure patterning process may be performed. For example, the second material layer 214 may be exposed to a first wavelength, and then, subsequently exposed to a second wavelength.

As noted above, the basicity of the second material layer 214 is decreased after the exposure process. Particularly, the second material layer comprises at least a photodegradable base and an electron acceptor, wherein the photodegradable amine (base) is linked to one or more functional groups comprising substantially delocalizable pi electrons by —C—. The highest occupied molecular orbital (HOMO) of the photodegradable base lies between the HOMO and lowest unoccupied molecular orbital (LUMO) of the electron acceptor. The electron acceptor HOMO is lower than the photodegradable base HOMO, and the electron acceptor LUMO is higher than the photodegradable base HOMO. Thus, after exposure, one of two reactions can occur: (1) an electron of the photodegradable base may be excited to the LUMO and transferred to the electron acceptor (i.e., the stronger base amine changes to a weak base imine) or (2) an electron of the electron acceptor may be excited to the LUMO and transferred to the photodegradable base (i.e., after the chemical reaction, the amine becomes a conjugated imine, decreasing its basicity). The decrease basicity in the exposed regions of the second material layer 214 provide improved acid/base distribution contrast, resulting in an improved pattern profile.

Subsequently, the second material layer 214 may be subjected to a post-exposure bake (PEB) process. After a pattern exposure and/or post-exposure bake (PEB) process, the PAG in the second material layer 214 (i.e., photoresist) may produce an acid and thus increase or decrease its solubility. The solubility may be increased for positive tone resist (i.e., the acid will cleave an acid cleavable polymer, resulting in the polymer becoming more hydrophilic) and decreased for negative tone resist (i.e., the acid will catalyze an acid catalyzed crosslinkable polymer or cause a polymeric pinnacle to undergo pinacol rearrangement, resulting in the polymer becoming more hydrophobic).

At step 110, the second material layer 214 is developed to form a pattern in the second material layer 214 by any suitable process. A developing solution may be utilized to remove portions of the second material layer 214, such as tetramethylammonium hydroxide (TMAH). Any concentration level of TMAH developer solution may be utilized, such as approximately 2.38% TMAH developer solution. The developing solution may remove the exposed or unexposed portions 214A, 214B depending on the resist type. For example, in the present embodiment, the second material layer 214 comprises a negative-type resist, so the exposed portions 214A are not dissolved by the developing solution and remain over the first material layer 212 (or substrate 210). If the second material layer 214 comprises a positive-type resist, the exposed portions 214A would be dissolved by the developing solution, leaving the unexposed portions 214B.

The remaining exposed portions 214A (or unexposed portions 214B) define a pattern. The pattern contains one or more openings, wherein portions of the underlying first material layer 212 (or substrate 210) are exposed. The pattern provides improved profile, critical dimension uniformity, and/or circularity. It is understood that subsequent processing may include removing the exposed portions of the first material layer 212 and/or substrate 210 within the openings. Alternatively, metal deposition, ion implantation, or other processes can be carried out over/on the first material layer 212 and/or substrate 210. The patterned second material layer 214 may then be removed or stripped and subsequent processing may continue.

In summary, the disclosed embodiments may provide a method for fabricating an integrated circuit device utilizing a photoresist layer comprising a photodegradable base. The photodegradable base is an amine linked with at least one functional group, which comprises substantially delocalizable pi electrons by a —C— group. The photodegradable base decreases within exposed areas of a photoresist layer, providing improved acid distribution and base distribution contrast, resulting ultimately in improved profile contrast. The disclosed embodiments may provide one or more advantages, such as improved lithography resolution, patterning profiles, critical dimension uniformity, and/or circularity. Also, the disclosed method and photoresist material provide reduced iso/dense bias. It is understood that different embodiments may have different advantages, and that no particular advantage is necessarily required of all embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photoresist material used for semiconductor device patterning, the photoresist material comprising:
   a polymer;
   a photoacid generator;
   a quencher base;
   an electron acceptor; and
   a photodegradable base.

2. The photoresist material of claim 1 further comprising at least one of a chromophore, a solvent, a surfactant, a photobase generator, and/or a crosslinker.

3. The photoresist material of claim 1 wherein the photodegradable base comprises an amine linked with a functional group comprising substantially delocalizable pi electrons by a —C— group.

4. The photoresist material of claim 1 wherein the photodegradable base is represented by the formula:

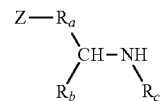

wherein $R_a$ comprises one of an aromatic ring, a monovalent functional group, a divalent functional group, or a trivalent functional group, $R_b$ comprises one of an aromatic ring, a monovalent functional group, a divalent functional group, or a trivalent functional group, $R_c$ comprises an unbranched group, a branched group, a cyclic group, a noncyclic group, a saturated group, an unsaturated group, an alkyl group, an alkenyl group, an alkynyl group, or an aromatic group, and Z is a pendant group.

5. The photoresist material of claim 4 wherein the pendant group is selected from the group consisting of: —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*, —C(O)R*, —Si(OR*)$_3$, —Si(R*)$_3$, or an epoxyl group.

6. The method of claim 5 wherein R* comprises at least one of hydrogen, an unbranched group, a branched group, a cyclic group, a noncyclic group, a saturated group, an unsaturated group, an alkyl group, an alkenyl group, or an alkynyl group.

7. The photoresist material of claim 4 wherein the functional groups of $R_a$ comprise at least one of an alkene, alkyne, —CO—, —C(=O)O—, —S—, —P—, —P(O$_2$)—, —C(=O)S—, —O—, —N—, —C(=O)N—, —SO$_2$O—, —SO$_2$S—, —SO—, or —SO$_2$—.

8. The photoresist material of claim 4 wherein $R_b$ and/or $R_c$ comprise at least one of —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*, —C(O)R*, —Si(OR*)$_3$, —Si(R*)$_3$, or an epoxyl group.

9. The photoresist material of claim 8 wherein R* comprises at least one of hydrogen, an unbranched group, a branched group, a cyclic group, a noncyclic group, a saturated group, an unsaturated group, an alkyl group, an alkenyl group, or an alkynyl group.

10. The photoresist material of claim 1 wherein the electron acceptor comprises at least one of a ketone, aldehyde, carboxylic acid, ester, amide, carbon dioxide, haloalkane, haloalkene, haloalkyne, alkene, alkyne, aromatic rings, other suitable groups, and/or combinations thereof.

11. A method for forming a pattern on a semiconductor device, the method comprising:
providing a substrate;
forming a first material layer over the substrate;
forming a second material layer over the first material layer, wherein the second material layer comprises a photodegradable base material; and
exposing one or more portions of the second material layer.

12. The method of claim 11 wherein forming the second material layer comprises depositing a photoresist layer with a photodegradable base material comprising an amine linked to at least one functional group having substantially delocalizable pi electrons by a —C— group.

13. The method of claim 11 further comprising:
performing a post-exposure baking process on the second material layer; and
developing the second material layer to form the pattern.

14. The method of claim 13 wherein developing the second material layer to form the pattern comprises utilizing a basic solution including tetramethylammonium hydroxide (TMAH).

15. The method of claim 11 wherein exposing one or more portions of the second material layer comprises causing the photodegradable base to decrease its basicity.

16. The method of claim 11 wherein exposing one or more portions of the second material layer comprises exposing the second material layer to radiation having a wavelength substantially less than 250 nm.

17. The method of claim 11 wherein the photodegradable base is represented by the formula:

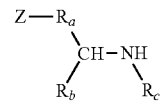

wherein $R_a$ comprises one of an aromatic ring, a monovalent functional group, a divalent functional group, or a trivalent functional group, $R_b$ comprises one of an aromatic ring, a monovalent functional group, a divalent functional group, or a trivalent functional group, $R_c$ comprises an unbranched group, a branched group, a cyclic group, a noncyclic group, a saturated group, an unsaturated group, an alkyl group, an alkenyl group, an alkynyl group, or an aromatic group, and Z is a pendant group.

18. The method of claim 17 wherein the pendant group is selected from the group consisting of: —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*, —C(O)R*, —Si(OR*)$_3$, —Si(R*)$_3$, or an epoxyl group.

19. The method of claim 18 wherein R* comprises at least one of hydrogen, an unbranched group, a branched group, a cyclic group, a noncyclic group, a saturated group, an unsaturated group, an alkyl group, an alkenyl group, or an alkynyl group.

* * * * *